United States Patent
Wang et al.

(10) Patent No.: US 11,757,223 B2
(45) Date of Patent: Sep. 12, 2023

(54) RECEPTACLE CONNECTOR SOCKET WITH EMBEDDED BUS BAR

(71) Applicant: Dell Products L.P., Round Rock, TX (US)

(72) Inventors: Isaac Q. Wang, Austin, TX (US); Timothy M. Lambert, Austin, TX (US); Corey D. Hartman, Hutto, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/230,712

(22) Filed: Apr. 14, 2021

(65) Prior Publication Data

US 2022/0336981 A1    Oct. 20, 2022

(51) Int. Cl.
*H01R 25/16* (2006.01)
*H01R 12/73* (2011.01)
*H01R 12/57* (2011.01)
*H01R 27/02* (2006.01)
*H05K 1/18* (2006.01)
*H01R 43/02* (2006.01)
*H01R 43/20* (2006.01)

(52) U.S. Cl.
CPC .......... *H01R 12/737* (2013.01); *H01R 12/57* (2013.01); *H01R 27/02* (2013.01); *H01R 43/0256* (2013.01); *H01R 43/20* (2013.01); *H05K 1/181* (2013.01); *H05K 2201/0999* (2013.01); *H05K 2201/10189* (2013.01); *H05K 2201/10492* (2013.01); *H05K 2201/10522* (2013.01)

(58) Field of Classification Search
CPC .............................. H01R 12/737; H01R 12/57
See application file for complete search history.

(56) References Cited

U.S. PATENT DOCUMENTS

| | | | | |
|---|---|---|---|---|
| 3,587,029 A * | 6/1971 | Knowles | ............ | H01R 13/6471 439/514 |
| 3,634,814 A * | 1/1972 | Inacker | ............ | H01R 12/7088 439/631 |
| 3,725,843 A * | 4/1973 | Johnson | ............ | H01R 12/7088 361/801 |
| 3,871,728 A * | 3/1975 | Goodman | ............ | H01R 13/6585 439/62 |

(Continued)

*Primary Examiner* — Neil Abrams
(74) *Attorney, Agent, or Firm* — Jackson Walker L.L.P

(57) ABSTRACT

An information handling system may include a printed circuit board and a plurality of connectors each electrically and mechanically coupled to the printed circuit board, each connector of the plurality of connectors configured to receive a respective modular information handling resource in order to electrically couple, via electrically-conductive pins of such connector, the respective modular information handling resource to the printed circuit board. Each connector may include a body comprising electrically non-conductive material and including a receptacle formed therein for receiving a mating edge connector of the respective modular information handling resource, a bus bar comprising electrically conductive material, other than the electrically-conductive pins of such connector, disposed within or upon the body and extending through at least a portion of the body, and an electrical termination electrically coupled to the bus bar.

20 Claims, 3 Drawing Sheets

(56) References Cited

U.S. PATENT DOCUMENTS

| | | | | |
|---|---|---|---|---|
| 4,487,464 A * | 12/1984 | Kirschenbaum | H01R 31/085 | 439/62 |
| 4,582,386 A * | 4/1986 | Martens | H01R 12/727 | 439/62 |
| 4,717,344 A * | 1/1988 | Schempp | H01R 12/7088 | 439/61 |
| 4,867,696 A * | 9/1989 | Demler, Jr. | H01R 12/7088 | 439/212 |
| 4,917,616 A * | 4/1990 | Demler, Jr. | H01R 12/737 | 439/579 |
| 5,035,631 A * | 7/1991 | Piorunneck | H01R 12/721 | 439/60 |
| 5,104,329 A * | 4/1992 | Brown | H01R 12/724 | 439/108 |
| 5,120,232 A * | 6/1992 | Korsunsky | H01R 12/00 | 439/108 |
| 5,127,839 A * | 7/1992 | Korsunsky | H01R 12/716 | 439/291 |
| 5,525,063 A * | 6/1996 | McMichen | H05K 7/1459 | 439/79 |
| 5,908,333 A * | 6/1999 | Perino | H01R 12/7076 | 439/631 |
| 6,015,299 A * | 1/2000 | Walse | H01R 13/6474 | 439/60 |
| 6,015,304 A * | 1/2000 | Yagi | H01R 13/658 | 439/108 |
| 6,217,347 B1 * | 4/2001 | Schell | H01R 12/722 | 439/79 |
| 6,273,759 B1 * | 8/2001 | Perino | H01R 12/716 | 439/631 |
| 6,322,392 B1 * | 11/2001 | Wang | H01R 13/6595 | 439/607.14 |
| 6,551,139 B1 * | 4/2003 | Yu | H01R 13/6594 | 439/607.22 |
| 6,592,407 B2 * | 7/2003 | Korunsky | H01R 12/721 | 439/108 |
| 7,320,623 B2 * | 1/2008 | Hisamatsu | H01R 12/721 | 439/108 |
| 7,513,779 B2 * | 4/2009 | Barr | H01R 12/716 | 439/620.2 |
| 7,585,185 B2 * | 9/2009 | Obikane | H01R 12/716 | 439/74 |
| 7,942,680 B2 * | 5/2011 | MacDougall | H01R 12/7088 | 439/60 |
| 8,162,680 B2 * | 4/2012 | Zhu | H01R 12/727 | 439/79 |
| 8,858,243 B2 * | 10/2014 | Luo | H01R 31/08 | 439/607.05 |
| 9,692,183 B2 * | 6/2017 | Phillips | H01R 13/6471 | |
| 11,121,506 B2 * | 9/2021 | Feng | H01R 13/6585 | |
| 2022/0336981 A1 * | 10/2022 | Wang | H01R 12/57 | |

* cited by examiner

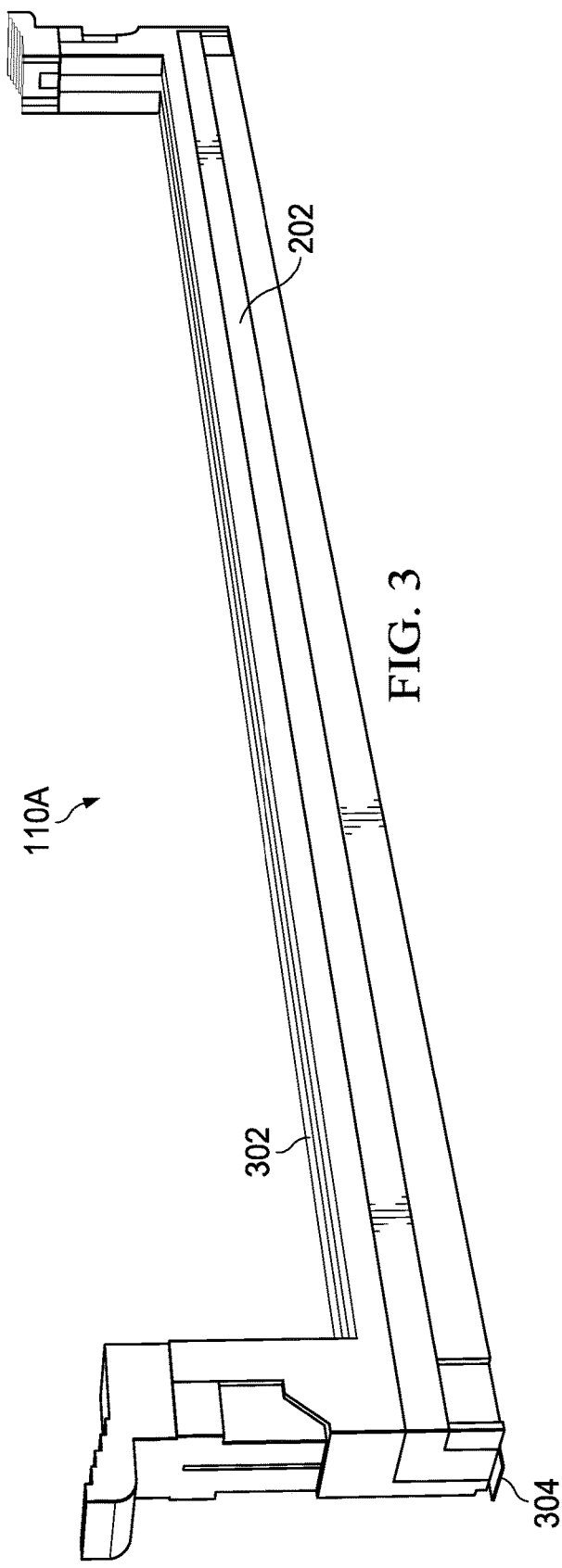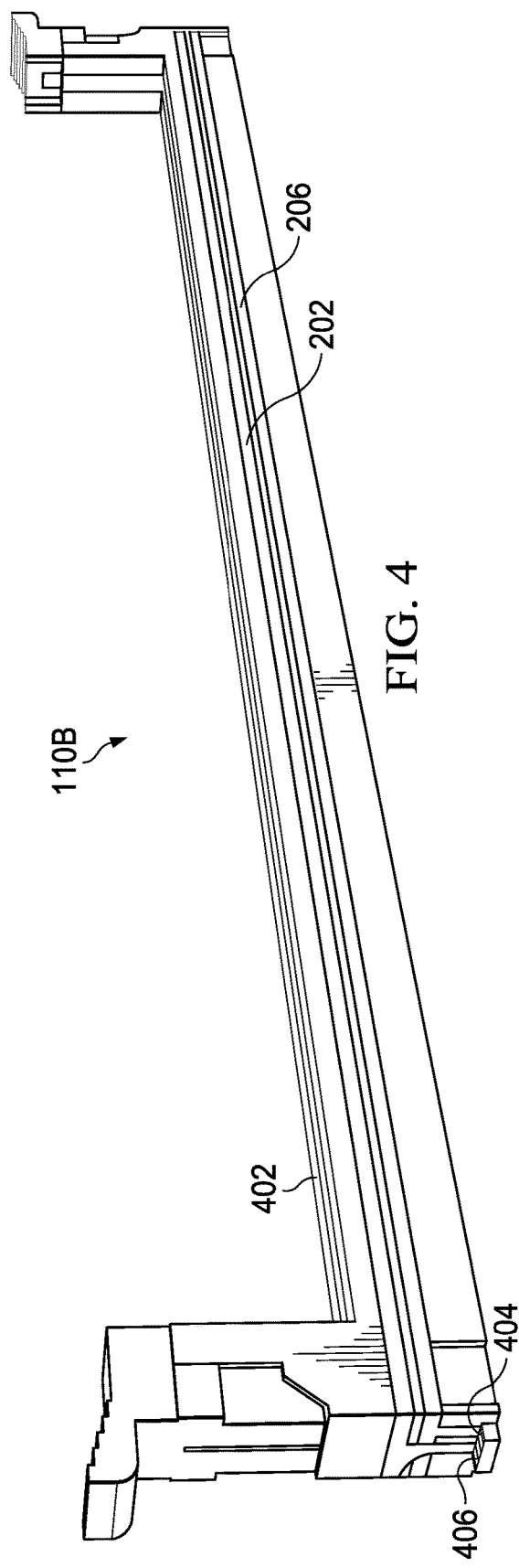

RECEPTACLE CONNECTOR SOCKET WITH EMBEDDED BUS BAR

TECHNICAL FIELD

The present disclosure relates in general to information handling systems, and more particularly to systems and methods for providing a receptacle connector socket with an external electrical delivery apparatus.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems often utilize memory, in the form of memory modules, such as dual in-line memory modules comprising a plurality of memory chips (e.g., random access memory). Memory modules are often implemented in accordance with an industry standard, such as Double Data Rate 5 Synchronous Dynamic Random-Access Memory (DDR5 SDRAM or simply "DDR5"). As compared to its predecessor standard, DDR5 uses a new power delivery scheme in which a Power Management Integrated Chip (PMIC) on a memory module receives a bulk input voltage (typically a 12-volt main voltage for servers and 5-volt main voltage for client machines) from a motherboard. A receptacle edge connector socket for receiving a memory module may have all of its pins for receiving such bulk input voltage at one end of the socket, in accordance with DDR5 module standards. In addition, modern processors are often pinned out such that half of the memory modules on a typical motherboard would require power from the rear side of a motherboard (e.g., where power sources are typically located) and half on the front side of the motherboard where the processor and other system components may reside.

This situation creates challenges in delivering power to components coupled to the motherboard, as high levels of electrical current may need to flow from the back of the motherboard (e.g., from power supply units) to the front of the motherboard (e.g., to memory, air movers, backplanes, etc.). Because the mid-section of the printed circuit board implementing a motherboard may be filled with numerous vias and high-speed routing (e.g., a 12-channel DDR5-based processor socket), the effective area of conductive metal within the printed circuit board may be limited. Thus, instead of flowing through a solid conductive metal plane, current may need to flow through a metal plane with numerous discontinuities (e.g., a "Swiss-cheese" like metal plane). Such discontinuity may lead to larger voltage drop across the plane (e.g., such drop proportional to the current multiplied by an electrical resistance of the plane), such that a receptacle edge connector socket for receiving a memory module may receive a desired bulk input voltage lower than the main voltage provided by power supply units).

SUMMARY

In accordance with the teachings of the present disclosure, the disadvantages and problems associated with existing approaches to electrical delivery in an information handling system may be reduced or eliminated.

In accordance with embodiments of the present disclosure, an information handling system may include a printed circuit board and a plurality of connectors each electrically and mechanically coupled to the printed circuit board, each connector of the plurality of connectors configured to receive a respective modular information handling resource in order to electrically couple, via electrically-conductive pins of such connector, the respective modular information handling resource to the printed circuit board. Each connector may include a body comprising electrically non-conductive material and including a receptacle formed therein for receiving a mating edge connector of the respective modular information handling resource, a bus bar comprising electrically conductive material, other than the electrically-conductive pins of such connector, disposed within or upon the body and extending through at least a portion of the body, and an electrical termination electrically coupled to the bus bar.

In accordance with these and other embodiments of the present disclosure, a connector for electrically coupling an information handling resource to a printed circuit board may include a body comprising electrically non-conductive material and including a receptacle formed therein for receiving a mating edge connector of the information handling resource and electrically coupling the information handling resource via electrically-conductive pins of such connector, a bus bar comprising electrically conductive material, other than the electrically-conductive pins of such connector, disposed within and upon the body and extending through at least a portion of the body, and an electrical termination electrically coupled to the bus bar.

In accordance with these and other embodiments of the present disclosure, a method may include forming within a body of a connector for electrically coupling an information handling resource to a printed circuit board, wherein the body comprises electrically non-conductive material, a receptacle for receiving a mating edge connector of the information handling resource to electrically couple the information handling resource via electrically-conductive pins of such connector, disposing within or upon the body and extending through at least a portion of the body, a bus bar comprising electrically conductive material, other than electrically-conductive pins of the connector, and an electrical termination electrically coupled to the bus bar.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 3 illustrates a perspective view of an example receptacle connector socket with external electrical delivery apparatus, in accordance with embodiments of the present disclosure; and FIG. 4 illustrates a perspective view of another example receptacle connector socket with external electrical delivery apparatus, in accordance with embodiments of the present disclosure.

DETAILED DESCRIPTION

Figure 1:
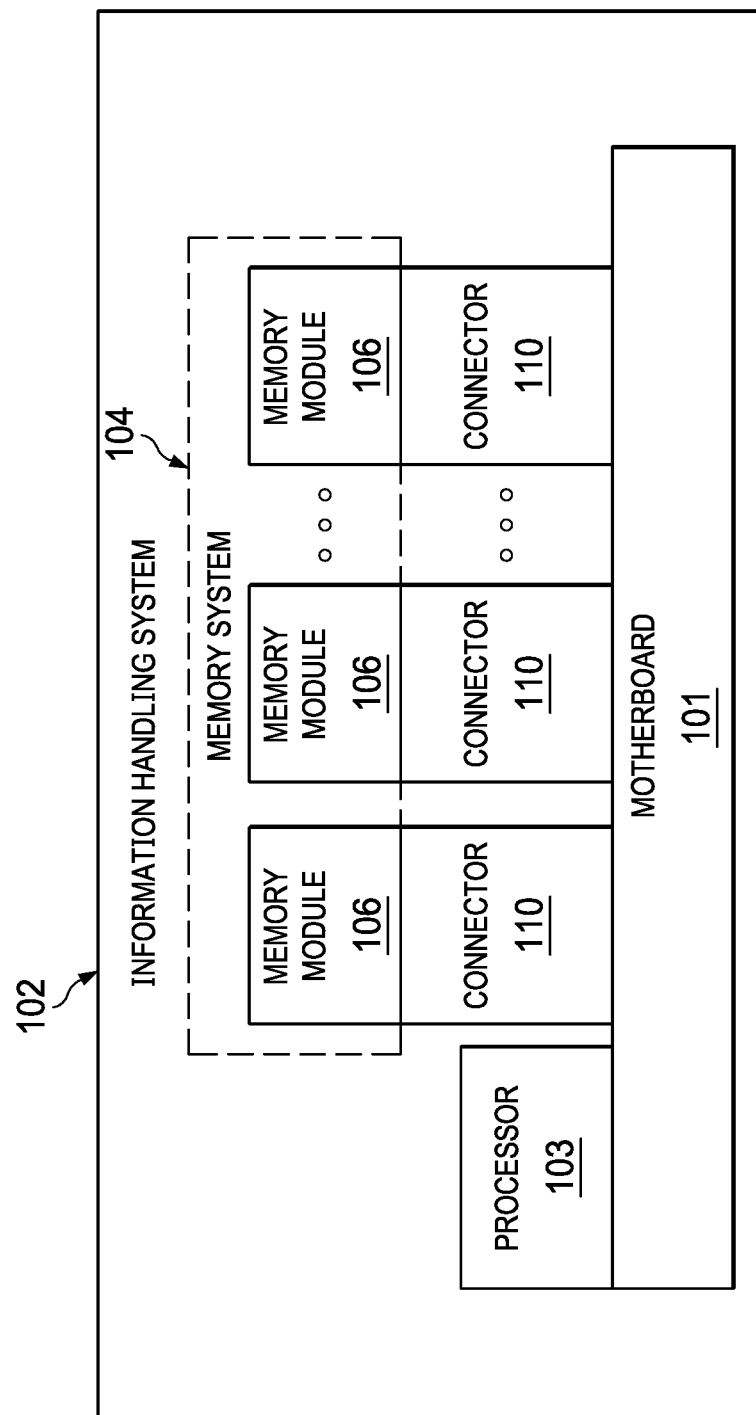
FIG. 1 illustrates a block diagram of selected components of an example information handling system, in accordance with embodiments of the present disclosure.

Preferred embodiments and their advantages are best understood by reference to FIGS. 1 through 4, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU"), microcontroller, or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, circuit boards may broadly refer to printed circuit boards (PCBs), printed wiring boards (PWBs), printed wiring assemblies (PWAs), etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

FIG. 1 illustrates a block diagram of an example information handling system 102. In some embodiments, information handling system 102 may comprise a server. In other embodiments, information handling system 102 may comprise networking equipment for facilitating communication over a communication network. In yet other embodiments, information handling system 102 may comprise a personal computer, such as a laptop, notebook, or desktop computer.

As shown in FIG. 1, information handling system 102 may include a motherboard 101, a processor 103 coupled to motherboard 101, a plurality of connectors 110 mechanically and electrically coupled to motherboard 101, and memory system 104 comprising a plurality of memory modules 106 each electrically coupled to motherboard 101 via a respective connector 110. Motherboard 101 may comprise a circuit board configured to provide structural support for one or more information handling resources of information handling system 102 and/or electrically couple one or more of such information handling resources to each other and/or to other electric or electronic components external to information handling system 102.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in a storage resource, memory system 104, and/or another component of information handling system 102.

Memory system 104 may be communicatively coupled to processor 103 and may comprise any system, device, or apparatus operable to retain program instructions or data for a period of time (e.g., computer-readable media). Memory system 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off. In particular embodiments, memory system 104 may comprise dynamic random access memory (DRAM).

As shown in FIG. 1, memory system 104 may be implemented by a plurality of memory modules 106 removably coupled to connectors 110. Each memory module 106 may include any system, device or apparatus configured to retain program instructions and/or data for a period of time (e.g., computer-readable media). A memory module 106 may comprise a dual in-line package (DIP) memory, a dual-inline memory module (DIMM), a Single In-line Pin Package (SIPP) memory, a Single Inline Memory Module (SIMM), a Ball Grid Array (BGA), or any other suitable memory module. In some embodiments, a memory module 106 may include a mating edge connector configured to mechanically and electrically couple to a corresponding receptacle slot or other opening of a connector 110.

A connector 110 may comprise any system, device, or apparatus fixedly mounted on motherboard 101 and may be constructed to mechanically couple a corresponding memory module 106 to motherboard 101 and to electrically couple such memory module 106 to motherboard 101, processor 103, and/or other components of information handling system 102. Connector 110 may comprise a socket including a receptacle slot or other opening configured to removably receive a corresponding mating edge connector of a memory module 106.

In addition to motherboard 101, processor 103, connectors 110, and memory modules 106, information handling system 102 may include one or more other information handling resources.

Figure 2:
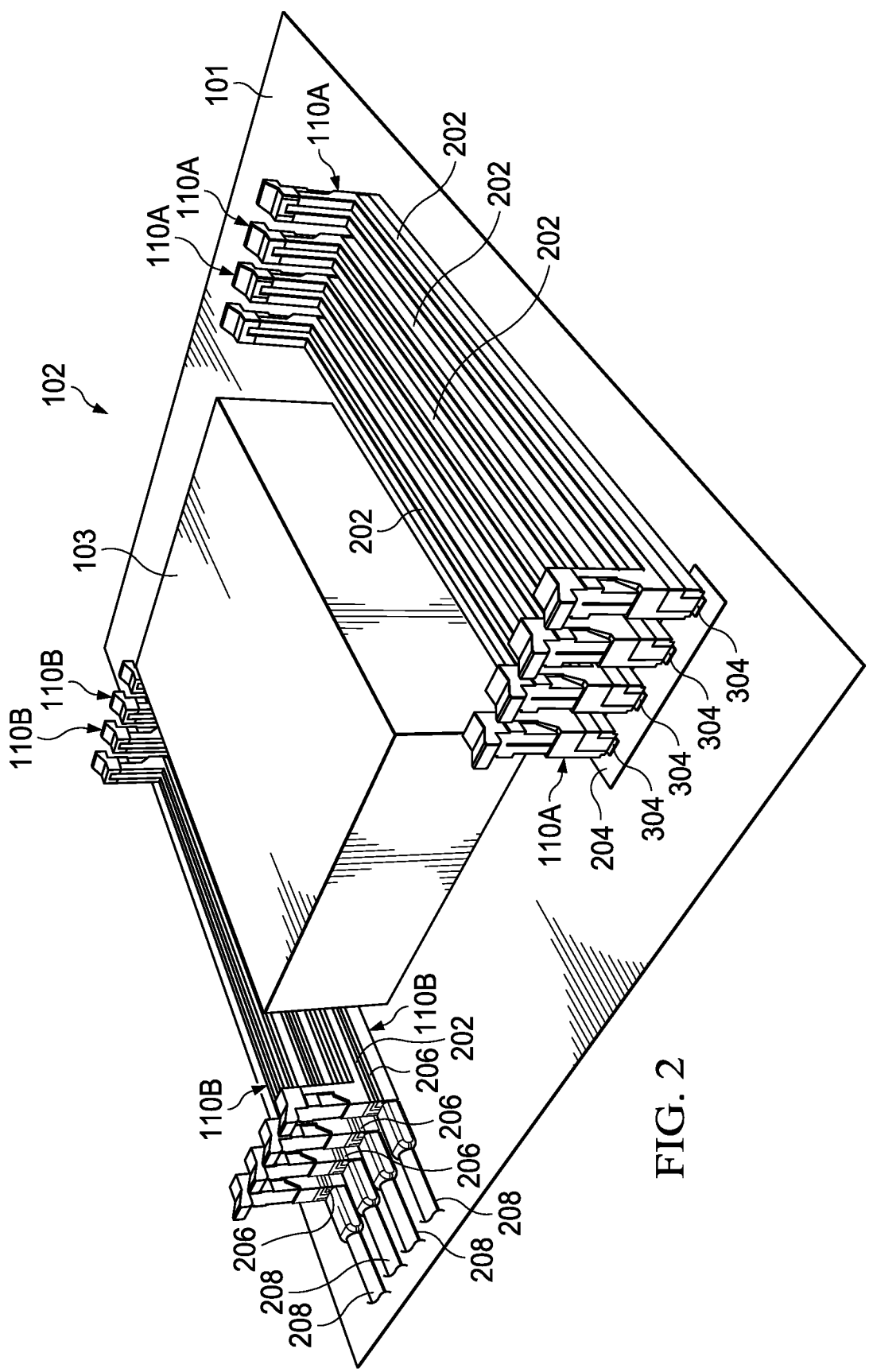
FIG. 2 illustrates a perspective view of selected components of the example information handling system of FIG. 1, in accordance with embodiments of the present disclosure.

FIG. 2 illustrates a perspective view of selected components of the example information handling system 102 shown in FIG. 1, in accordance with embodiments of the present disclosure. In particular, FIG. 2 illustrates information handling system 102 comprising processor 103, and a plurality of connectors 110 (e.g., connectors 110A and 110B) unpopulated by memory modules 106, for purposes of clarity and exposition.

Connectors 110 are shown in FIG. 2 as comprising two different types of connectors 110: a first type of connector 110A having a single bus bar 202 embedded within connector 110A and a second type of connector 110B having two bus bars 202 and 206 embedded within connector 110B. FIG. 3 illustrates a perspective view of example receptacle connector 110A, in accordance with embodiments of the present disclosure, and FIG. 4 illustrates a perspective view of example receptacle connector 110B, in accordance with embodiments of the present disclosure.

Although connector 110A is depicted as having a single bus bar 202 and connector 110B is depicted as having two bus bars 202 and 206, it is understood that a connector 110 may include any suitable number of bus bars, in accordance with embodiments of the present disclosure.

As shown in FIGS. 2 and 3, in some embodiments, connector 110A may include bus bar 202 embedded within a groove or other recess formed within the exterior of a body 302 of connector 110A, wherein body 302 may be formed of an electrically non-conductive material, such as plastic. In some embodiments, bus bar 202 may not be formed with a recess within the exterior of a body 302 of connector 110A, but may instead be formed as a continuous bump or protrusion running alongside connector 110A. Further, while FIGS. 2 and 3 depict bus bar 202 as being visible from the exterior of connector 110A, in some embodiments, bus bar 202 may be "buried" within body 302, such that it is predominantly not visible from the exterior of connector 110A.

Bus bar 202 may be formed from any suitable electrically-conductive material (e.g., copper or other metal). As also shown in FIGS. 2 and 3, bus bar 202 may be terminated on at least one end of connector 110A with a soldering pad 304 for electrically coupling bus bar 202 to a board pad 204 of conductive material (e.g., copper or other material). Accordingly, in operation, a power rail within motherboard 101 may be electrically coupled to pad 204, allowing for transmission of electrical current through bus bar 202. For example, in some embodiments, bus bar 202 may be used to deliver electrical current from pad 204 to pins of connectors 110A. As another example, in some embodiments, soldering pads 304 and board pads 204 may be located at each end of connector 110A, allowing for transmission of electrical energy from one end of connector 110A to the other (e.g., to transmit electrical energy from components located on one side of connector 110A to components located on the other side of connector 110A).

As shown in FIGS. 2 and 4, connector 110B may include a first bus bar 202 embedded within a first groove or other recess formed within the exterior of a body 402 of connector 110B and a second bus bar 206 embedded within a second groove or other recess formed within the exterior body 402, wherein body 402 may be formed of an electrically non-conductive material, such as plastic. In some embodiments, either or both of bus bar 202 and 206 may not be formed with a recess within the exterior of a body 402 of connector 110B, but may instead be formed as a continuous bump or protrusion running alongside connector 110A. Further, while FIGS. 2 and 4 depict bus bars 202 and 206 as being visible from the exterior of connector 110B, in some embodiments, one or both of bus bars 202 and 206 may be "buried" within body 402, such that they are predominantly not visible from the exterior of connector 110B.

Bus bar 202 and bus bar 206 may each be formed from any suitable electrically-conductive material (e.g., copper or other metal). As also shown in FIGS. 2 and 4, each bus bar 202 and 206 may be terminated on at least one end of connector 110B with a respective cable connector 404, 406 for electrically coupling bus bar 202 and bus bar 206 to a respective cable 208. Accordingly, in operation, a power rail within a cable 208 may be electrically coupled to either of cable connector 404, 406, allowing for transmission of electrical current to or from such cable 208 through bus bar 202 or bus bar 206. For example, in some embodiments, one or both bus bars 202, 206 may be used to deliver electrical current from a cable 208 coupled to one of cable connectors 404, 406 to pins of connectors 110B. As another example, in some embodiments, cable connectors 404, 406 may be located at each end of connector 110B, allowing for transmission of electrical energy from one end of connector 110B to the other (e.g., to transmit electrical energy from components located on one side of connector 110B to components located on the other side of connector 110B).

Although FIGS. 2 and 3 depict the single bus bar connector 110A being terminated by a soldering pad 304 and coupled to a board pad 204, in some embodiments, a connector 110 in accordance with this disclosure may comprise a single bus bar connector 110 similar to connector 110A but terminated on at least one end with a cable connector similar to connector 110B. Further, although FIGS. 2 and 4 depict the dual bus bar connector 110B being terminated by cable connectors 404, 406 for coupling to one or more cables, in some embodiments, a connector 110 in accordance with this disclosure may comprise a dual bus bar connector 110 similar to connector 110B but terminated on at least one end with a soldering pad similar to connector 110A.

Further, in some embodiments, a connector 110 may be terminated by both a cable connector similar to connector 110B and a soldering pad similar to connector 110A. For example, a connector 110 may be terminated at one end by a cable connector similar to connector 110B and terminated at its other end by a soldering pad similar to connector 110A. As another example, a dual bus bar connector 110 similar to connector 110B may be terminated at the same end by both a cable connector connected to one bus bar and a soldering pad coupled to the other bus bar.

Also, although FIG. 2 depicts an information handling system 102 comprising two different types of connectors 110A and 110B, an information handling system 102 may include only one type of connector 110 or multiple types of connectors 110.

In addition, although the foregoing contemplates the use of bus bars 202 and 206 for delivery of power within information handling system 102, in some embodiments, a bus bar 202 and/or 206 may be used for delivery of electrical signals in addition to or in lieu of power delivery.

Additionally, although the foregoing contemplates the use of bus bars 202 and 206 for delivery of power and electrical signals to motherboard 101 and memory modules 106, within information handling system 102, in some embodiments, a bus bar 202 and/or 206 may be used for delivery of electrical signals or power to any suitable component or information handling resource of information handling system 102.

Moreover, although the foregoing contemplates use of bus bars 202 and 206 embedded in a receptacle connector socket for memory modules, any suitable type of receptacle connector socket for memory modules or any other type of information handling resource may have one or more bus bars embedded therein, in accordance with embodiments of the present disclosure.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
   a printed circuit board; and
   a connector electrically and mechanically coupled to the printed circuit board and configured to receive a respective modular information handling resource in order to electrically couple, via electrically-conductive pins of the connector, the respective modular information handling resource to the printed circuit board, wherein the connector comprises:
   an elongated body comprising electrically non-conductive material and including a receptacle formed therein for receiving a mating edge connector of the respective modular information handling resource;
   a plurality of bus bars including a first bus bar comprising electrically conductive material, other than the electrically-conductive pins of such connector, embedded within a first elongated recess formed in an elongated exterior surface of the body and a second bus bar comprising electrically conductive material, other than the electrically-conductive pins of such connector, embedded within a second elongated recess formed in the elongated exterior surface, the first and second recesses extending a length of the elongated exterior surface between opposing ends of the elongated exterior surface; and
   a first electrical termination electrically coupled to the first bus bar.

2. The information handling system of claim 1, wherein the second electrical termination is electrically coupled to the second bus bar.

3. The information handling system of claim 1, wherein the first electrical termination is coupled to an end of the first bus bar.

4. The information handling system of claim 1, wherein the first electrical termination comprises a soldering pad of electrically-conductive material.

5. The information handling system of claim 4, wherein the printed circuit board comprises a board pad of electrically-conductive material coupled to the soldering pad.

6. The information handling system of claim 1, wherein the first electrical termination comprises a cable connector.

7. The information handling system of claim 6, wherein the information handling system further comprises a cable electrically coupled to the cable connector.

8. A connector for electrically coupling an information handling resource to a printed circuit board, comprising:
   an elongated body comprising electrically non-conductive material and including a receptacle formed therein for receiving a mating edge connector of the information handling resource and electrically coupling the information handling resource via electrically-conductive pins of such connector;
   a plurality of bus bars including a first bus bar comprising electrically conductive material, other than the electrically-conductive pins of such connector, embedded within a first elongated recess formed in an elongated exterior surface of the body and a second bus bar comprising electrically conductive material, other than the electrically-conductive pins of such connector, embedded within a second elongated recess formed in the elongated exterior surface, the first and second recesses extending a length of the elongated exterior surface between opposing ends of the elongated exterior surface; and
   a first electrical termination electrically coupled to the first bus bar.

9. The connector of claim 8, wherein the first bus bar is disposed within an exterior of the body within a first recess formed in the body.

10. The connector of claim 8, wherein the first electrical termination is coupled to an end of the first bus bar.

11. The connector of claim 8, wherein the first electrical termination comprises a soldering pad of electrically-conductive material.

12. The connector of claim 11, wherein the soldering pad is configured to electrically couple to a board pad of a printed circuit board.

13. The connector of claim 8, wherein the first electrical termination comprises a cable connector.

14. A method comprising:
    forming within an elongated body of a connector for electrically coupling an information handling resource to a printed circuit board, wherein the elongated body comprises electrically non-conductive material, a receptacle for receiving a mating edge connector of the information handling resource to electrically couple the information handling resource via electrically-conductive pins of such connector;
    disposing within the body and extending through at least a portion of the body, a plurality of bus bars including a first bus bar comprising electrically conductive material, other than electrically-conductive pins of the connector embedded within a first elongated recess formed in an elongated exterior surface of the body, and a second bus bar comprising electrically conductive material, other than the electrically-conductive pins of such connector, embedded within a second elongated recess formed in the elongated exterior surface of the body; and
    a first electrical termination electrically coupled to the first bus bar.

15. The method of claim 14, further comprising a second electrical termination electrically coupled to the second bus bar.

16. The method of claim 14, further comprising coupling the first electrical termination to an end of the first bus bar.

17. The method of claim 14, wherein the first electrical termination comprises a soldering pad of electrically-conductive material.

18. The method of claim 17, further comprising electrically coupling the soldering pad to a board pad of a printed circuit board.

19. The method of claim 14, wherein the first electrical termination comprises a cable connector.

20. The method of claim 19, further comprising electrically coupling the cable connector to a cable.

* * * * *